United States Patent [19]
Foerstel et al.

[11] Patent Number: 5,567,177
[45] Date of Patent: Oct. 22, 1996

[54] SURFACE MOUNT CHIP CARRIER

[75] Inventors: Joseph W. Foerstel, Sunnyvale; Sandeep Vij, San Jose, both of Calif.

[73] Assignee: Altera Corporation, San Jose, Calif.

[21] Appl. No.: 381,005

[22] Filed: Jan. 30, 1995

Related U.S. Application Data

[63] Continuation of Ser. No. 10,260, Jan. 28, 1993, abandoned, which is a continuation-in-part of Ser. No. 874,281, Apr. 24, 1992, Pat. No. 5,301,416.

[51] Int. Cl.$^6$ ............................................. H01R 23/72
[52] U.S. Cl. ............................................. 439/526; 206/724
[58] Field of Search .................... 439/68–73, 525, 439/526, 330, 331; 206/724

[56] References Cited

U.S. PATENT DOCUMENTS

| | | | |
|---|---|---|---|
| 3,409,861 | 11/1968 | Barnes et al. | 439/526 |
| 4,220,383 | 9/1980 | Scheingold et al. | 439/680 |
| 4,288,841 | 9/1981 | Gogal | 361/414 |
| 4,435,724 | 3/1984 | Ralstin | 357/79 |
| 4,551,747 | 11/1985 | Gilbert et al. | 357/74 |
| 4,717,347 | 1/1988 | Babow et al. | 439/72 |
| 4,758,176 | 7/1988 | Abe et al. | 439/331 |
| 4,783,697 | 11/1988 | Benenati et al. | 357/80 |
| 4,872,845 | 10/1989 | Korsunsky et al. | 439/70 |
| 4,906,802 | 3/1990 | Castleman | 174/52.4 |
| 4,918,513 | 4/1990 | Kurose et al. | 357/74 |
| 4,934,944 | 6/1990 | Kozel et al. | 439/68 |
| 4,954,088 | 9/1990 | Fujizaki et al. | 439/81 |
| 5,020,998 | 6/1991 | Ikeya et al. | 439/266 |
| 5,026,303 | 6/1991 | Matsuoka et al. | 439/526 |
| 5,073,116 | 12/1991 | Beck, Jr. | 439/331 |
| 5,088,930 | 2/1992 | Murphy | 439/330 |
| 5,100,333 | 3/1992 | Suzuki | 439/73 |
| 5,147,209 | 9/1992 | Litwin et al. | 439/72 |
| 5,266,037 | 11/1993 | Hetzel et al. | 439/72 |
| 5,301,416 | 4/1994 | Foerstel | 439/526 |

FOREIGN PATENT DOCUMENTS

| | | | |
|---|---|---|---|
| 1550797 | 12/1968 | France . | |
| 2365899 | 4/1978 | France | H01R 33/94 |

OTHER PUBLICATIONS

Joseph W. Foerstel, "Carrier Concept" Internal Drawing, drawing made on Dec. 15, 1990.

*Primary Examiner*—Neil Abrams
*Attorney, Agent, or Firm*—Townsend and Townsend and Crew, LLP

[57] ABSTRACT

An apparatus and method are disclosed to permit handling an electronic device (20) during programming, development, and other steps. The apparatus include a carrier (2) having a cavity (15) in which the electronic component is immobilized and protected during handling. The carrier cavity can have an opening that permits access to the electronic component. The carrier/device combination is inserted into a socket (35) which includes a plurality of leads (30) with associated contacts for making electrical connection with the electronic component leads (21). The leads of the socket have a footprint identical to that of the electronic component.

17 Claims, 9 Drawing Sheets

SURFACE MOUNT CHIP CARRIER

This application is a continuation of application Ser. No. 08/010,260, filed Jan. 28, 1993, now abandoned, which is a continuation-in-part of U.S. Ser. No. 07/874,281, filed Apr. 24, 1992, U.S. Pat. No. 5,301,416 which is incorporated herein by reference for all purposes.

BACKGROUND OF THE INVENTION

The present invention lies in the field of handling apparatus for electronic components. More specifically, the present invention relates to mounting structures and carriers for repeatedly mounting electronic components in various environments such as during programming and/or development.

Very often electronic components must be mounted and dismounted from one or more environments by surface mounting or other methods. For example, field programmable logic devices as well as other types of programmable integrated circuits (herein "programmable device") such as the Altera MAX 7000 series devices, are typically tested, erased and reprogrammed numerous times, especially during development of prototypes. These cycles of erasure, reprogramming and development require that the device be repeatedly mounted on and dismounted from various printed circuit boards or other substrates.

Surface mount electronic components often are soldered, or otherwise affixed to a board or substrate. Such mounting procedures generally are intended to be permanent or at least semi-permanent. Unfortunately, it is difficult, and sometimes impossible, to repeatedly mount and dismount such surface mount electric components. To do so involves considerable time and effort on the part of the person or machine required to perform the dismounting and remounting steps. In addition, devices with fragile features are easily damaged or destroyed during the dismounting procedure. The substrate on which they are mounted can also be damaged.

Programmable devices and other electronic components often have many fine leads (typically 100 or more) precisely arranged in close proximity to one another in a lead "footprint." Because the boards on which these components are mounted have a corresponding footprint, the arrangement of leads must not be altered. Unfortunately, these small leads are fragile, susceptible to bending and deviation from their precise footprint.

In addition, many electronic components possess other features that are easily damaged. Often it will be necessary to handle these delicate components with specialized apparatus so that human hands seldom, if ever, touch the device. Furthermore, some field programmable devices are erased by directing ultraviolet radiation through a window on the device. Thus, care must be exercised to ensure that this window is not covered with a material that blocks or scatters ultraviolet radiation.

To protect against the above-noted types of damage to electronic components, vacuum wands and other specialized devices often are used for handling; however, such devices are expensive and often cumbersome to use.

For the above reasons, it is desirable to have improved apparatus for moving and mounting various electronic components from one environment to another.

SUMMARY OF THE INVENTION

The present invention provides an improved method for repeatedly mounting and dismounting surface mount electronic components, particularly delicate devices, without the need for expensive or elaborate equipment. The apparatus and method of the present invention allow a user to pick up, move and mount these devices manually. Thus, for example, the various tasks that must be performed during development of a prototype device can be accomplished with ease.

In one aspect of the present invention, an apparatus is provided for holding an electronic component which has a body and a plurality of leads defining a lead footprint. The apparatus includes a carrier (which actually holds or contains the electronic component) and a socket for holding the carrier/component combination. The carrier includes a cavity having a shape and dimensions that allow it to at least partially surround and immobilize the electronic component. The carrier also includes a portion that will protect the leads of fragile components from deformation. The socket includes features which allow engagement of the carrier/component combination. In some embodiments, a lid is provided to cover the carrier and engage the socket by a latch or other mechanism. The socket also includes one or more contacts arranged such that electrical contact is made between these contacts and the plurality of leads on the electronic component when the socket engages the carrier/component combination. In addition, the socket has a plurality of socket leads arranged in the same lead footprint employed in the electronic component.

In some embodiments, the carrier will have an opening or aperture so that the electronic component can be probed, marked, or otherwise accessed while immobilized in the carrier. For devices in which ultraviolet light or other radiation must reach the surface, for example a UV erasable EPROM, the carrier includes an opening so that when the programmable device is immobilized in the carrier, ultraviolet radiation can pass through to the window of the programmable device. This enables the device to be erased and reprogrammed (and tested, if necessary) without being removed from the carrier.

To provide a stable environment during erasure, as well as during programming and development operations, the carrier preferably will be made from an antistatic or static dissipative material that remains mechanically and electrically stable at temperature extremes and upon exposure to ultraviolet radiation.

Another aspect of the present invention provides a method for handling an electronic component. In this method, the electronic component is first inserted into a carrier having a cavity and features for protecting the device leads as described above. Next, the carrier and electronic component are inserted into a socket having a plurality of contacts arranged within the socket in a manner allowing electrical contact between the leads of the electronic component and the contacts of the socket. While in the socket, an electrical function is performed that utilizes the electronic component. If the component is a programmable device, this function may include burn-in, testing or programming. Finally, the component and carrier combination can be removed from the socket and either mounted in a different socket or placed in another apparatus.

A further understanding of the present invention may be obtained by referring to the following discussion and associated drawings.

DESCRIPTION OF THE SPECIFIC EMBODIMENTS

Figure 1:
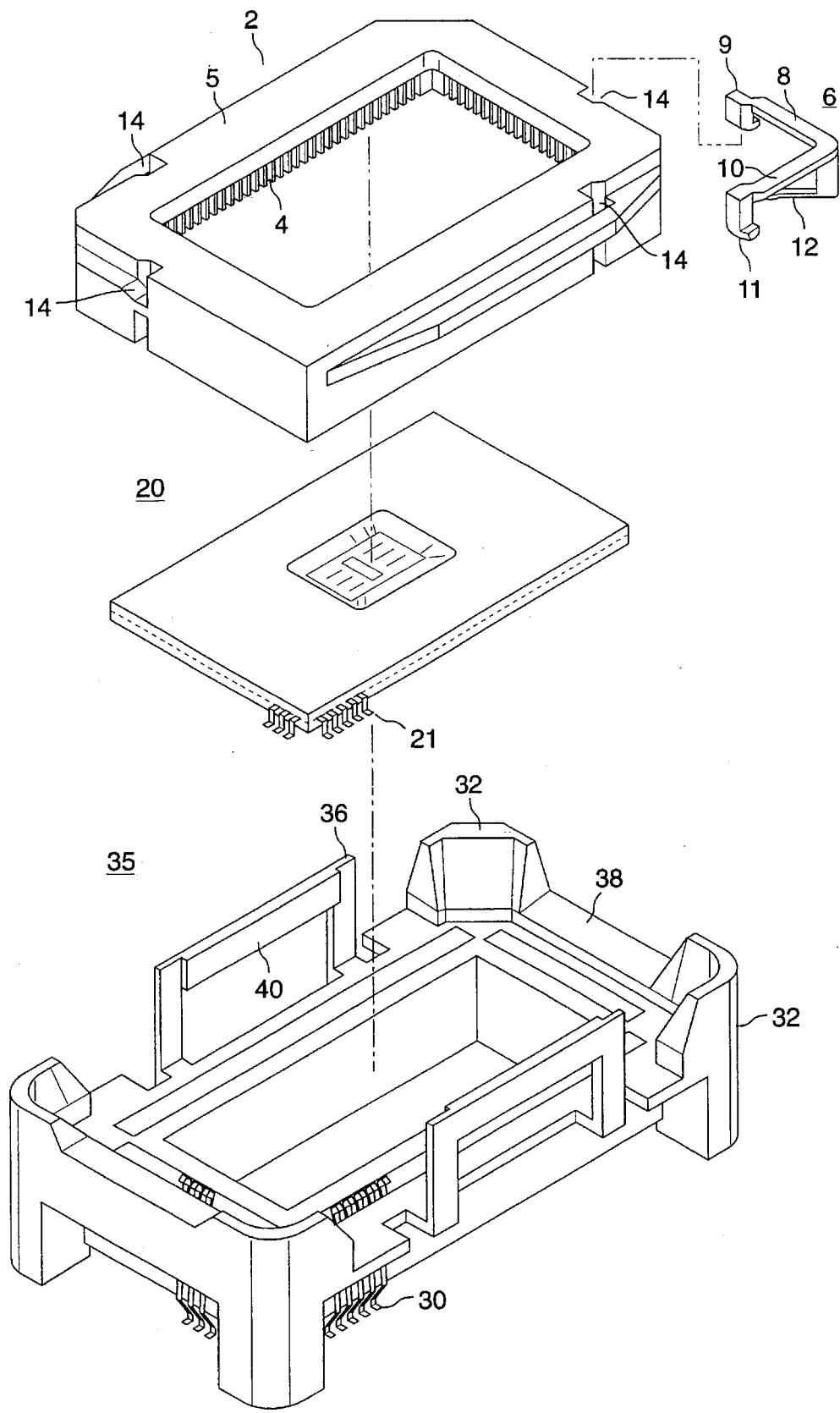
FIG. 1 is an exploded perspective view of a preferred carrier, electronic component, and development socket of the present invention.

The present invention includes at least two different elements to aid in the safe handling of electronic components. The first element is a carrier designed to hold and/or immobilize the electronic component and protect its leads from deformation. Thus, the user can pick up and move the carrier/component combination by grasping the carrier, without touching the sensitive component. The second element of the invention is a surface mount or through-hole socket which engages and holds the carrier/component combination. Different sockets typically will be used for development, testing, programming and other applications. The development socket preferably will have a lead footprint that matches that of the electronic component. Thus, the development socket can be mounted on any board designed to mount the electronic device. This eliminates any need to design a "prototype" board for the component which is different from the "production" board.

The socket leads each terminate in a contact which provides a conduction pathway between the device and the printed circuit board. Thus, when the socket engages the carrier, the leads of the electronic component are forced into intimate contact with corresponding contacts in the socket.

After testing or another operation conducted in the socket is completed, the carrier and component combination is removed and transferred to a different environment or stored. Thus, the combination of the carrier and electronic component may be used again and again in various environments including programming and testing environments. In each instance, the carrier and electronic device combination may be handled without fear of damaging the component.

Preferred carriers and sockets of the present invention are able to protect the electronic component leads from damage. Typically, lead damage is defined as any deformation of the form of the lead greater than that specified in JEDEC Publication 95, Issue A MO-108. Preferred carriers meeting this criteria have outlines that allow the user to handle the component without actually touching it.

In some embodiments, the carrier will also allow access to the package for special purposes such as diagnostic probing (in which the protective covering on the package may be removed). In addition, it will often be desirable to mark the specific components used during the back end of a development process. Preferred carriers permit such markings.

As used herein "electronic component" refers to any of a variety of devices and components having electrical, magnetic or optical functions. Such electronic components can have resistive, capacitive, information storage (i.e., memory), logic, or other functions. Examples of such components include capacitors, transistors, diode arrays, optical devices, integrated circuits, multichip modules, etc. In most instances the electronic components used with the present invention will be provided in surface mount packages, although through-hole packages may also be used.

Surface mount packages generally provide leads that are affixed to a printed circuit board or other substrate on the side of the board or substrate facing the component. Examples of surface mount packages include quad flat packages (QFP), small outline packages (SOP), thin small outline packages (TSOP), small outline J-lead packages (SOJ), plastic leaded chip carriers (PLCC), leadless chip carriers (LCC), and other designs known to those versed in the art. A discussion of many of these packages, as well as through-hole packages, can be found in *The Microelectronics Packaging Handbook*, R. Tummala and E. Rymaszewski, Eds., Von Nostrand Reinhold, New York (1989) which is incorporated herein by reference for all purposes.

Referring now to FIG. 1, a preferred carrier 2 of the present invention is displayed. Carrier 2 includes a shell 5 which is shown having four sides and an aperture in the center. The size and shape of the aperture are chosen to correspond to the outer dimensions and shape of an electronic component 20 that the carrier will contain. The carrier shown is designed for use with a device having a generally rectangular shape. The outer dimensions of shell 5 are chosen to allow easy manual handling of the carrier, without the user touching the electronic component. For example, if the component has a length of approximately 20 mm, the carrier might then have a corresponding length of about 25 mm. Of course, these dimensions are not limiting, and devices of other sizes and shapes can be used. Shell 5 includes a plurality of slots 4 which correspond to the location of the fine pitch leads 21 on the electronic component. The portion of the shell containing these slots is sufficiently rigid to prevent lateral and normal stresses on the carrier from being transferred to the component leads. Thus, the leads will be protected from damage as described above.

Clips 6 are used to engage the electronic component while it is disposed within shell 5. Clips 6 contain arms 8 and 10 and mounting pin 12. Arms 8 and 10 terminate in fasteners 9 and 11 which snap into place at notch 14 on shell 5. Of course, other mechanisms may be used to hold the component in the carrier. Preferred mechanisms permit the component to be easily inserted and removed from the carrier. For instance, a snap-type latch built into the shell 5 could be employed. Alternatively, a removable tab or a threaded, screw-type mechanism could be used.

Figure 2:
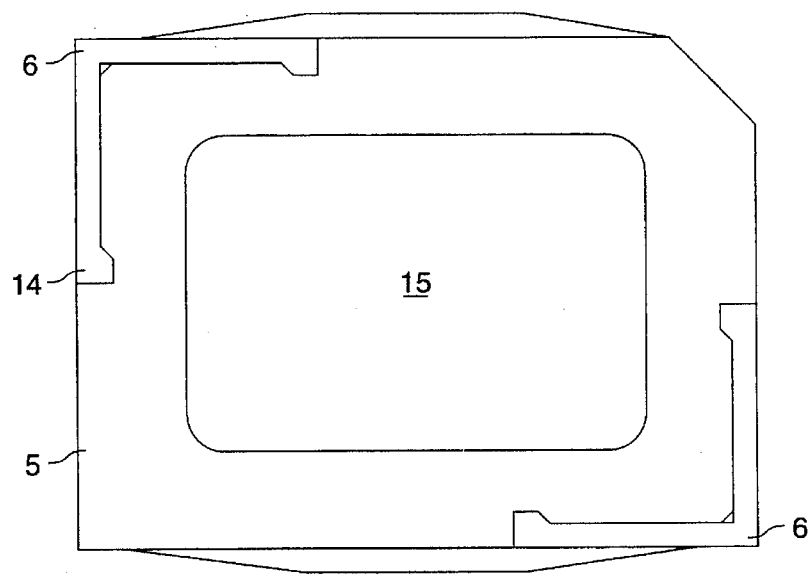
FIG. 2 presents a schematic top view of the preferred carrier with clips for holding an electronic component.

FIG. 2 shows a top view of carrier 2 with clips 6 engaged in notches 14. Aperture 15 is also shown surrounded by shell 5. Aperture 15 is large enough to permit access to the electronic component for marking or another purpose. For example, if the electronic device is an erasable programmable device having a window designed to transmit ultraviolet light during the erasure process, the aperture 15 preferably should not obstruct the device window. For an exemplary device of about 20 mm in length, the aperture will be about 16–20 mm in length. Of course, other sizes and shapes may be used depending on the characteristics and applications of the electronic component. Some carriers will have no aperture, but rather will have a cover to additionally protect the component. Still other carriers will have a cavity to hold the component in place.

The aperture of carrier 2 preferably is designed to accommodate one or more slightly different sized and shaped electronic components. As is known in the art, devices having similar characteristics (such as lead footprints) may be fabricated with different types of packaging, such as ceramic, plastic or other materials. In addition, the package design may be one of various industry standard types such as QFP, SOP, or other types listed above. Often the outer sizes and shapes vary from package to package. To address this variability, the carriers of the present invention preferably will accommodate two or more different types of standard packaging. This may be accomplished, for example, by making the aperture profile slightly oversized at the region where the package dimension differences lie.

Figure 3:
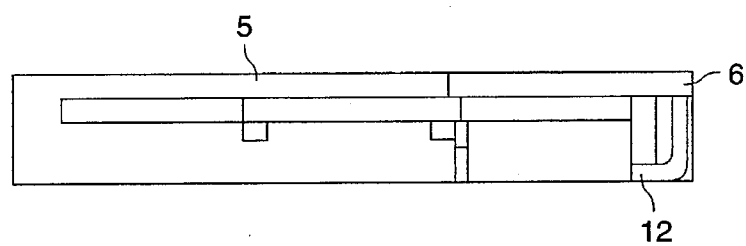
FIG. 3 presents a schematic side view of the carrier shown in FIGS. 1 and 2.
Figure 4:
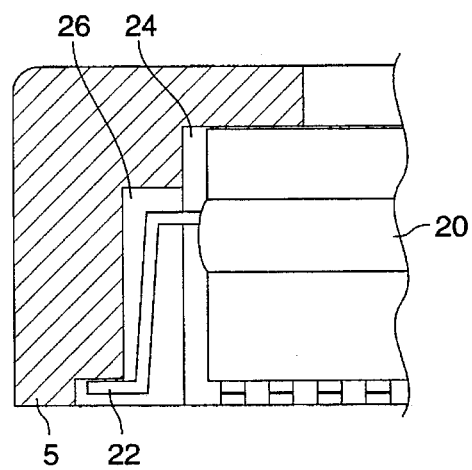
FIG. 4 presents a cross-sectional view of a preferred carrier with the electronic component in place.

FIG. 3 presents a side view of the carrier arrangement including shell 5 and clip 6. As shown, mounting pin 12 engages the underside of shell 5 and is used to lock the electronic component in place. FIG. 4 shows the component 20 including lead 22 held within the carrier shell 5. Inside the aperture of carrier shell 5 is shoulder 24 designed to accommodate the top edges of the component 20. Also in carrier shell 5 is shoulder 26 designed to accommodate the lead 22. The exact positions and radii of these shoulders will vary depending upon the range of component packages to be used with the carrier.

Referring again to FIG. 1, the clips 6 of carrier 2 are typically deflected for insertion of the component 20. The arms 8 and 10 of clips 6 pivot within notches 14 to disengage mounting pins 12 from the underside of shell 5. This permits the component 20 to slide into the aperture of carrier 2. Once the component is in place within the aperture and the leads of the component are positioned within slots 4, clips 6 are pivoted about notches 14 so that mounting pin 12 engages component 20 holding the component in place. The component and carrier assembly can then be handled by users without specialized apparatus such as vacuum wands. The user may elect to move the component between testing apparatus, development apparatus, erasure apparatus, etc. if so desired.

Shell 5 preferably is made from a sturdy, nearly rigid material. In addition, the shell preferably is made from an electrically and mechanically stable material, able to withstand extremes in temperature and electric field. The carrier preferably is made from a static dissipative or antistatic material. In addition, the material should be electrically and mechanically stable at temperatures ranging from about about −60° C. to about 160° C. If the carrier is used to handle UV-erasable devices, it should be made from a material that remains mechanically stable after multiple prolonged exposures to ultraviolet radiation.

Suitable materials having the above characteristics will be known to those of skill in the art. Polyethersulphone in combination with other materials is one such preferred carrier material. Liquid crystal polymers in combination with other materials are other preferred carrier materials. Of course, other polymers, ceramics, glasses and other materials may be used.

Often a component must have its functions tested during development. This is typically accomplished by mounting the device on an appropriate testing apparatus. Unfortunately, this process can sometimes damage the component leads. In addition, if the component is successfully mounted, its leads sometimes break loose because of differences in the coefficients of thermal expansion between the component and the test system substrate. After testing, the component usually is dismounted for programming or other purposes. Unfortunately, dismounting may also damage the leads and destroy the device, particularly if the component is surface mounted.

The present invention avoids the above difficulties by providing a surface mount development socket to protect the component during testing or other functions such as burn-in. This is accomplished without the need to surface mount the component leads. Thus, the development socket preferably will have the same surface mount footprint as the electronic component. In addition, the socket will have a holding mechanism that engages the carrier and electronic device combination.

In the embodiment shown in FIG. 1, development socket 35 includes four pillars 32 connected by a perimeter side wall 38, which together provide structural support for surface mounting. A plurality of leads 30 extend down from the side wall 38 and have an identical footprint to the electronic component. Thus, the socket and carrier combination may be mounted on any printed circuit board or other substrate designed to accommodate the ultimate production version of the electronic component. Thus, the development socket preferably will be surface mountable by standard industry methods, including wave solder, IR reflow solder, hot air reflow solder, as well as hand soldering with a soldering iron or hot air unit.

The upper ends of leads 30 terminate in a series of contacts (not shown) inside side wall 38. These contacts are used to provide electrical contact to the leads of the programmable device. Suitable contact materials include a beryllium/copper alloy with tin plating. Latches 36 protrude above perimeter side wall 38 to which they are affixed. Guide posts (not shown) extend below the bottom surface of pillars 32. The guide posts serve to align the entire development socket on predefined regions of the printed circuit board. Of course, the board must then have holes complementary to guide posts to permit correct mounting. To allow for additional flexibility, the development socket may be made without guide posts or with adjustable guide posts (not shown).

The development socket body may be made from a variety of materials, including polymers, ceramics, glass, and other insulating compositions. Preferably it is made from a polymeric material by a molding process. The polymer or other material is chosen to be an antistatic material with an insulation resistance of no less than about 1,000 megohms at 500 volts D.C. Further, the material should be mechanically and electrically stable from about 0° C. to about 100° C.

Liquid crystal polymer has been found to be a suitable material for the development socket. In addition, glass filled polysulphone having the required properties is also suitable. Other suitable polymers, ceramics, glasses, etc. having the above properties will be known to those of skill in the art.

Figure 5:
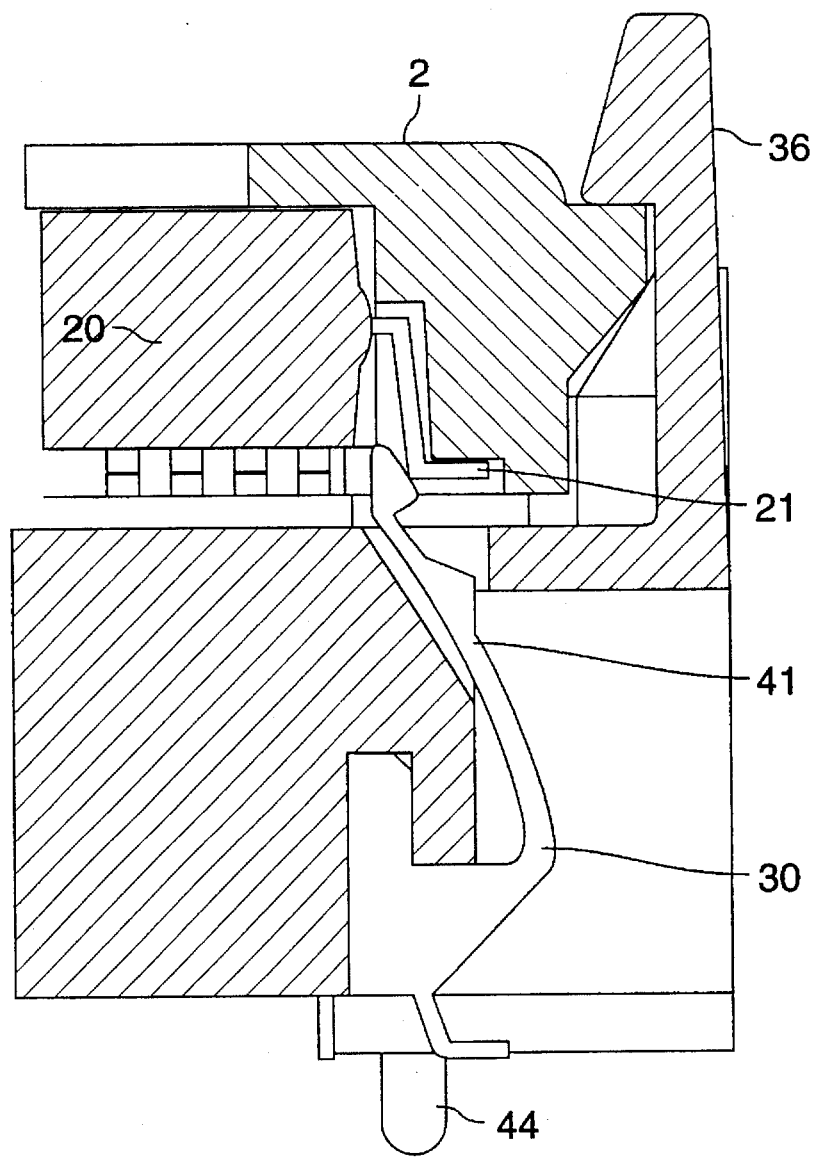
FIG. 5 presents a schematic cross-sectional view of the development socket in engagement with the carrier and electronic component.

The carrier and component arrangement are mounted in the development socket from above as shown in FIG. 1. The electronic component rests on the development socket such that its leads are in electrical contact with the contacts inside the side wall 38. Preferably, electrical contact resistance will be less than about 30 milliohms at 10 mA/20 mV as measured in accordance with Mil. Std. 1344. As shown in FIG. 5, the component lead 21 touches contact 41 at the end of development socket lead 30. Because the programmable device 20 is held in place by the socket and carrier arrangement, electrical contact is ensured during development testing.

In one embodiment, the electronic component 20 is held in place when carrier 2 is inserted into the region between the latches 36. The lip 40 on latches 36 engages the top surface of carrier 2 when the entire arrangement is assembled and ready for mounting. In this position, the component can participate in an electronic function such as testing or programming.

Because the latches 36 are preferably made from a somewhat flexible material, the carrier and component assembly snaps into place when gently pushed onto the socket. Likewise, the carrier component assembly is removable by spreading the latches apart and pulling out the carrier. Although this procedure may be accomplished without tools, in some embodiments it is desirable to use a specially designed tool to spread the latches and extract the carrier. The structure of such tools will be readily apparent to those of skill in the art.

Figure 6:
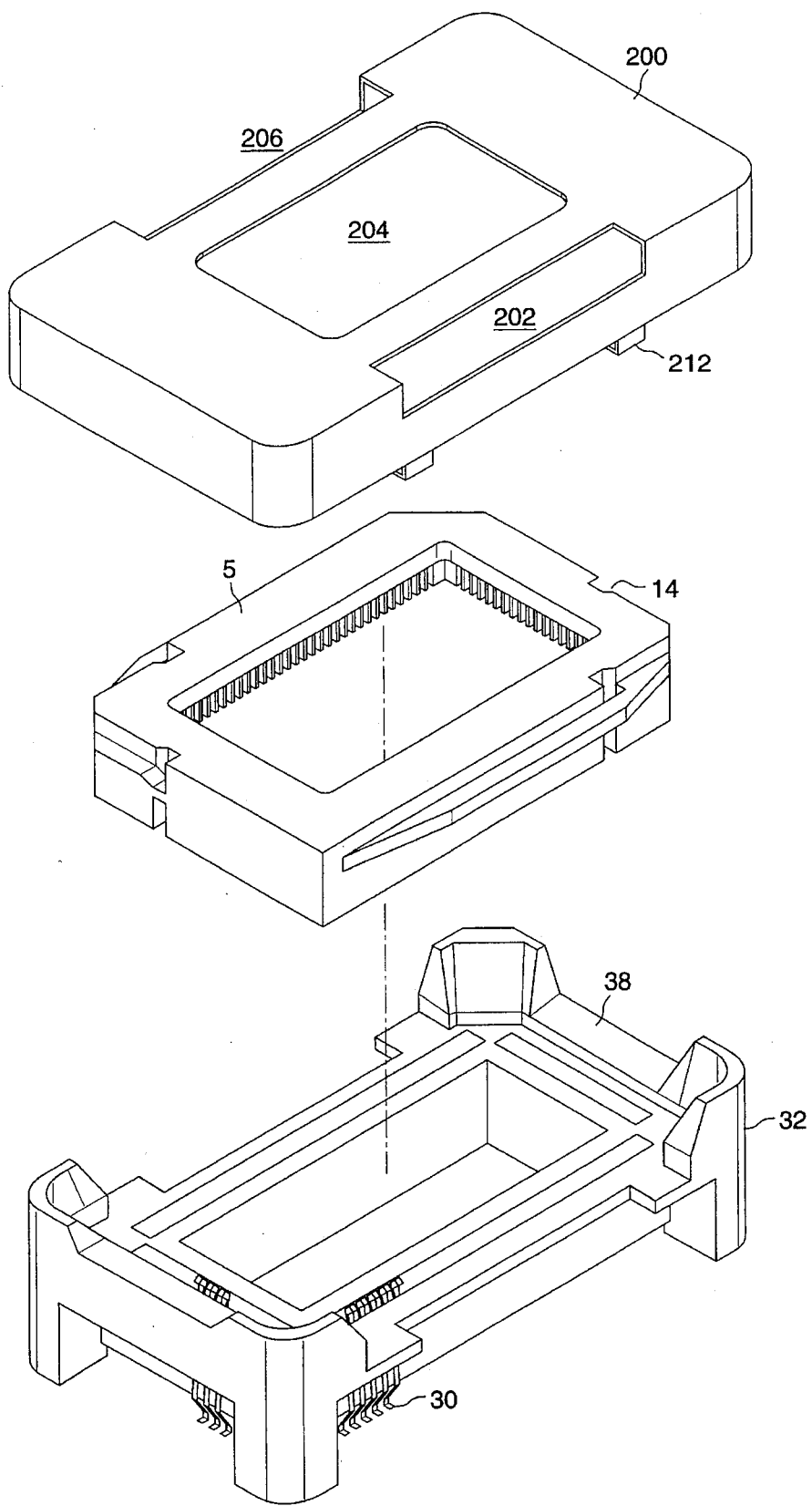
FIG. 6 presents an exploded perspective view of a development socket with a lid arrangement.

In some embodiments, a two-piece development socket such as the device shown in FIG. 6 will be employed. As shown there, the second piece of the development socket is a lid or covering 200 having lips 212 extending inward from the sides of the lid. The lid snaps into engagement with the development socket body over the carrier and electronic component. Thus, the carrier and chip assembly is held in place within the development socket without the need for the latches 36 shown in FIG. 1. A plurality of windows or openings 202, 204, and 206 in lid 200 serve to allow removal of the lid by hand or removal tool.

Figure 7:
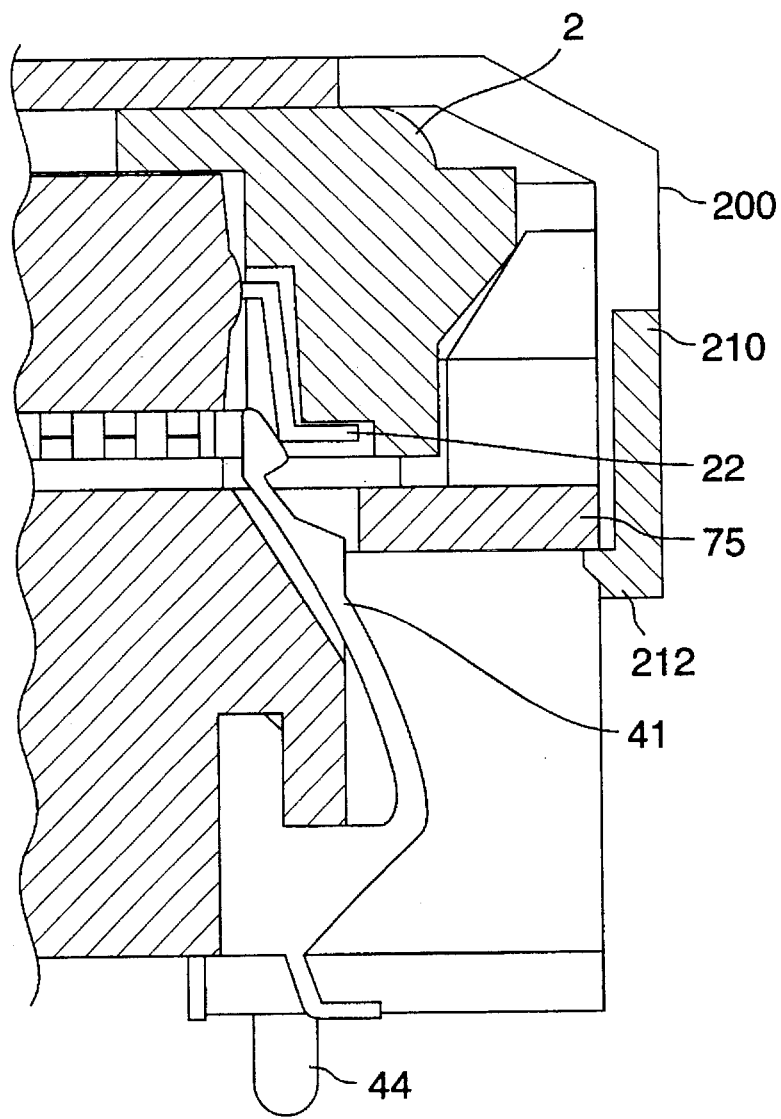
FIG. 7 presents a schematic side view of the lid engaging the development socket with carrier in place.

FIG. 7 shows lid 200 in engagement with a rim 75 on the development socket side-wall. As shown, the lid includes a tab 210 having lip 212 that engages a complementary ridge 75 of the development socket. sides of the lid are made sufficiently resilient that the lip 212 will deflect away from the socket body as the lid pressed onto the socket, and then snap into place when the lip passes beyond rim 75. In preferred embodiments, the lid is made from polyethermide or ULTEM. When situated in the socket, the carrier 2 and electronic component 20 assembly are bounded on the lower side by the interior of the development socket and on the upper side by lid 200. Thus, the component lead 22 is held in position against development socket contact 41. As shown, lid 200 is sized to fit over carrier 2 when positioned in the development socket. Alignment post 44 is also shown.

Figure 8:
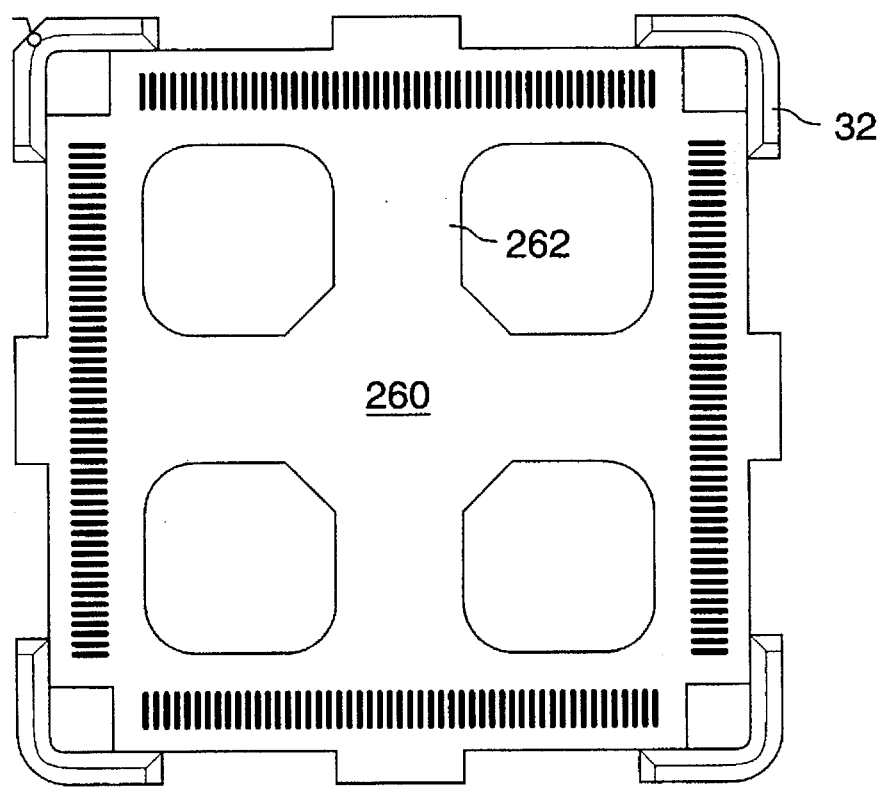
FIG. 8 presents a top view of the development socket including a cross-shape base.

In some embodiments, the bottom of the development socket includes a base 260 located below the region where the carrier and component assembly are typically situated. In the embodiment of FIG. 8, base 260 is a cross shape having arms 262 contacting each of the four sides of the development socket. The cross serves as a target pad for vacuum pickup so that the socket can be handled without the danger of contacting the delicate lead footprint. To provide a larger target for the vacuum device, the arms 262 may be widened near the center of the cross as shown in FIG. 8. Of course, other base geometries may be employed. For example, the base may be solid or may contain more than four arms.

The present invention also provides a through-hole or surface mount manufacturing socket that will accept, for example, a fine pitch memory or programmable device contained within the carrier. Thus, the device may remain in the carrier while it is being tested or programmed. The manufacturing socket may be employed in applications that require hundreds or thousands of insertions and that generate extreme temperatures and electric fields. As an example, the manufacturing socket can be used in burn-in processes to cause failure of marginal devices. In comparison to the development socket, the manufacturing socket may have a variety of sizes and lead footprints, depending upon the electronic component and desired application. Generally, the development socket will have the identical footprint of the electronic component.

Figure 9:
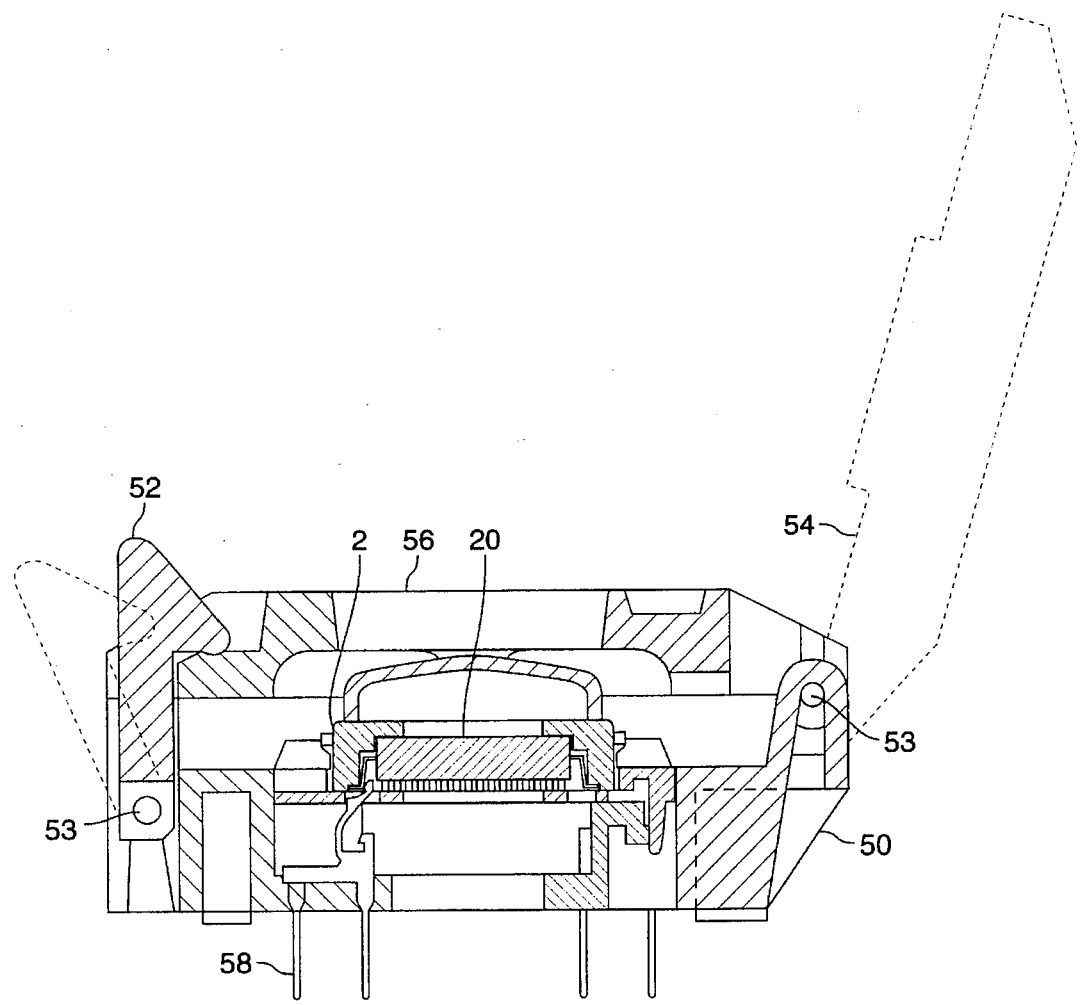
FIG. 9 presents a cross-sectional view of a preferred manufacturing socket with carrier.

FIG. 9 is a cross-sectional schematic view of a preferred manufacturing socket of the present invention. The socket 50 includes a cover which pivots about hinge 53 between open and closed positions 54 and 56. After carrier 2 and electronic component 20 are inserted into the manufacturing socket, cover 54 is closed, forcing latch 52 to pivot about hinge 53 from its resting position. When cover 56 reaches the completely closed position latch 52 snaps back to its resting position thus holding cover 56 in the closed position during programming or another function. Preferably, hinge 53 is biased toward the resting or upright position shown. Thus, a preferred latching mechanism can easily be worked with one hand. The manufacturing socket also includes guide pins 58 which provide electrical contact with the environment and hold the socket in place.

Figure 10:
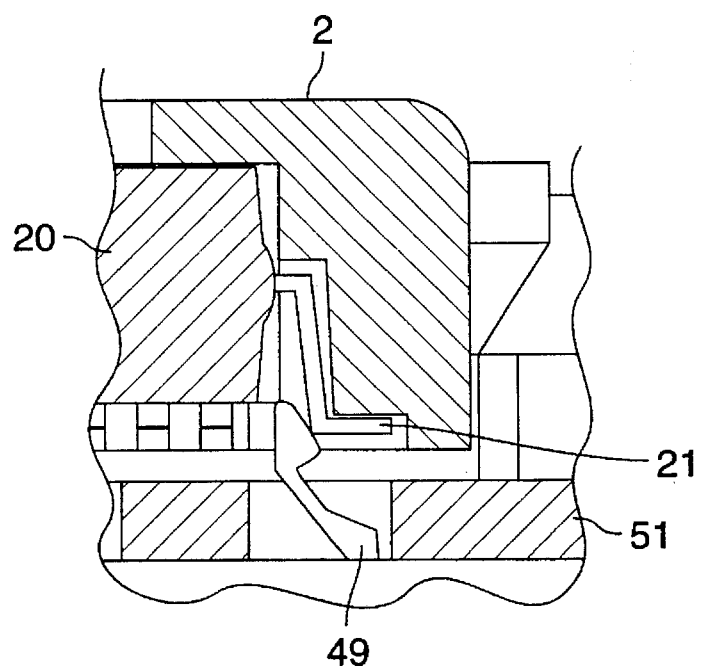
FIG. 10 presents a cross-sectional view of a section of the manufacturing socket in engagement with the carrier and component.

FIG. 10 is a cross-sectional view illustrating the arrangement of the carrier 2 and component 20 in engagement with the manufacturing socket. As shown, component lead 21 is in electrical contact with manufacturing socket contact 49.

Like the development socket, the manufacturing socket should provide a contact resistance (with the electronic component) of less than about 30 milliohms at 10 mA/20 mV as measured in accordance with Mil. Std. 1344. The manufacturing socket contacts will preferably be sufficiently rugged to allow at least about 50,000 insertion and removal cycles. One suitable contact material is gold plated beryllium/copper alloy. Other suitable alloys will be known to those of skill in the art.

Figure 11:
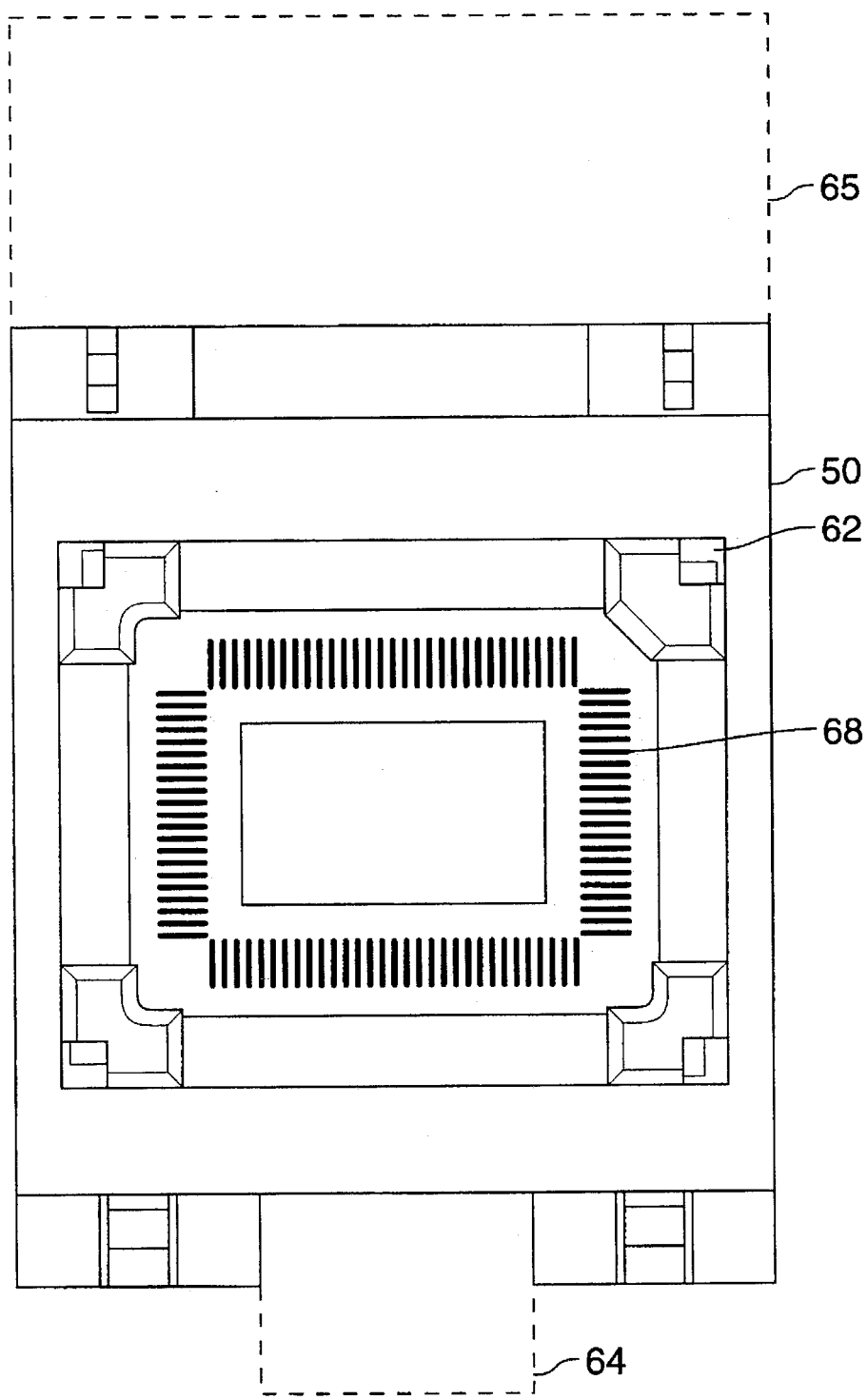
FIG. 11 presents a schematic top view of the manufacturing socket without a carrier present.

FIG. 11 is a top view of manufacturing socket 50 without the component and carrier assembly inserted. As shown, manufacturing socket 50 includes four posts 62. In addition, the clearance area for latch 52 is displayed at 64. Also, the clearance area for cover 54 is shown at 65. A plurality of lead regions 68 correspond to the positions of the device leads when the device carrier assembly is held in the manufacturing socket.

Preferably, the manufacturing socket is made from an antistatic material having an insulation resistance of greater than about 1,000 megohms at 500 volts D.C. In addition, the material should be mechanically and electrically stable over a temperature range of about −60° C. to about 160° C. Suitable materials include a variety of polymeric materials. It has been found that polyphenylene sulfide, 40% glass filled, is a particularly preferred material. Another suitable material is liquid crystal polymer having the above properties. Other suitable materials will be apparent to those of skill in the art.

Although the above discussion has focused on certain preferred embodiments of the present invention, some variations of the apparatus and method will be apparent to those skilled in the art. For example, the carrier could take on a variety of shapes in addition to the generally rectangular shape presented in the preferred embodiment. In addition, the sockets of this invention may, in some instances, have a variety of structural arrangements different from the pillared design shown in the preferred embodiments. These and other modifications are intended to be included within the scope of the claims appended hereto.

What is claimed is:

1. Apparatus for holding and handling by hand a standard electronic component during manufacturing, testing, and prototyping, the component having a three dimensional body with the larger two dimensions designated the horizontal dimensions forming a polygon with no protuberances and defining an upper surface and a lower surface and the third dimension being a vertical thickness of said component, said component having a plurality of leads defining a lead footprint, said leads extending outward from the component in one of the horizontal dimensions and bent to extend vertically in the thickness dimension, the apparatus comprising:

a carrier including
a cavity having a shape and dimensions to at least partially surround and immobilize the electronic component said carrier having dimensions nearly the same as the dimensions of said component to allow easy manual handling of the carrier without the user touching the electronic component, said carrier including receiving groves for partially surrounding and immobilizing said leads in said outward and said vertical dimensions; and
a plurality of indentations in the body of said carrier for receiving a plurality of clips, said clips engaging the carrier on at least an upper surface and engaging the device on at least a lower surface and holding the device firmly in place in the carrier, and a prototype socket comprising:
means for engaging the carrier and the electronic component,
a plurality of contacts arranged within the socket to make electrical contact between the contacts and the plurality of leads of the electronic component when the socket engages the carrier, and
a plurality of socket leads arranged in the lead footprint of the electronic component, each lead having an extended stem for electrically coupling with one of said contacts, wherein said lead, including a lead portion for coupling with a printed circuit board and a portion of said stem, is substantially exposed and accessible from outside the socket; and a manufacturing and testing socket comprising:
a cavity for engaging the carrier and the integrated circuit package;
a plurality of contacts arranged within the socket to make electrical contact with the leads of the integrated circuit package while said package is housed in said carrier; and
a plurality of socket leads arranged to effectively engage the socket in a manufacturing device said socket leads not necessarily arranged in the lead footprint of the integrated circuit package wherein said carrier is capable of engaging both the prototype socket and the manufacturing and testing socket.

2. Apparatus as recited in claim 1 wherein the electronic component includes a window transparent to electromagnetic radiation and the carrier includes an opening permitting electromagnetic radiation to strike the window when the carrier immobilizes the electronic component.

3. Apparatus as recited in claim 1 wherein the carrier includes a shell portion and the means for protecting the leads comprises a plurality of slots in the shell portion, each slot adapted to receive one lead and separate that lead from adjoining leads.

4. Apparatus as recited in claim 3 wherein each of the socket contacts is disposed to electrically contact a component lead when the carrier is engaged in the socket.

5. Apparatus as recited in claim 1 wherein the carrier includes clip means for holding the electronic component in position.

6. Apparatus as recited in claim 1 wherein the socket includes a base in the shape of a cross.

7. Apparatus as recited in claim 1 further comprising structural support means for surface mounting.

8. Apparatus as recited in claim 7 wherein said structure support means comprises a plurality of pillars.

9. Apparatus as recited in claim 8 further comprising a plurality of guide posts, each of said guides posts extends below a bottom surface of one of said pillars for aligning said socket on said printed circuit board.

10. Apparatus for holding an electronic component, the component having a three dimensional body and a plurality of leads defining a lead footprint, the apparatus comprising:

a carrier having a three dimensional body with the larger two dimensions designated the horizontal dimensions and defining an upper surface and a lower surface and the third dimension defining a vertical thickness of said carrier, the dimensions of said body being minimized for easy handling including
a cavity having a shape and dimensions to at least partially surround the electronic component, and
means for immobilizing the electronic component within said carrier, and
means for protecting leads which extend outward from said package in one of the horizontal dimensions and vertically in the thickness dimension from deformation; and a manufacturing socket including
a carrier receiving region having a shape and dimensions to at least partially surround the carrier,
a plurality of socket contacts arranged within the carrier receiving region to make electrical contact with the plurality of leads of the electronic component when the socket engages the carrier, and
a plurality of socket leads arranged in the lead footprint of the electronic component, each lead having an extended stem for electrically coupling with one of said socket contacts, wherein said lead, including a lead portion for coupling with a printed circuit board and a portion of said stem, is substantially exposed and accessible from outside the socket; and
a lid adapted to engage the socket and at least partially surround the carrier; and a prototype socket comprising:
means for engaging the carrier and the electronic component,
a plurality of contacts arranged within the socket to make electrical contact between the contacts and the plurality of leads of the electronic component when the socket engages the carrier, and
a plurality of socket leads arranged in the lead footprint of the electronic component, each lead having an extended stem for electrically coupling with one of said contacts, wherein said lead, including a lead portion for coupling with a printed circuit board and a portion of said stem, is substantially exposed and accessible from outside the socket.

11. Apparatus as recited in claim 10 wherein the lid includes one or more windows.

12. Apparatus as recited in claim 10 wherein the lid has one or more lips adapted to engage the socket.

13. Apparatus as recited in claim 10 wherein the socket carrier region includes a base disposed below and adjacent the carrier.

14. Apparatus as recited in claim 10 further comprising structural support means for surface mounting.

15. Apparatus as recited in claim 14 wherein said structure support means comprises a plurality of pillars.

16. Apparatus as recited in claim 15 further comprising a plurality of guide posts, each of said guide posts extends below a bottom surface of one of said pillars for aligning said socket on said printed circuit board.

17. A system for handling integrated circuit packages, said packages having a plurality of leads, comprising a carrier, at least one prototype socket, and at least one manufacturing socket, wherein said carrier is capable of engaging both the prototype socket and the manufacturing socket and wherein said carrier comprises:
  a shell with a cavity having a shape and dimensions to at least partially surround the integrated circuit package, said shell having a three dimensional body with the larger two dimensions designated the horizontal dimensions and defining an upper surface and a lower surface and the third dimension defining a vertical thickness of said shell
  a plurality of slots defined in said shell such that when the integrated circuit package is inserted in said cavity the integrated circuit package leads which extend outward from said package in one of the horizontal dimensions and vertically in the thickness dimension are recessed in said slots and are thus completely inaccessible to damage when the carrier/package combination is manipulated by hand; and
  a plurality of fasteners that engage an outer surface of said shell and at least one surface of said package and are capable of securely holding a standard integrated circuit package in said carrier while said carrier is handled manually; and wherein said prototype socket comprises:
  a cavity for engaging the carrier and the integrated circuit package;
  a plurality of contacts arranged within the socket to make electrical contact with the leads of the integrated circuit package while said package is housed in said carrier; and
  a plurality of socket leads arranged in the lead footprint of the integrated circuit package; and wherein said manufacturing socket comprises:
  a cavity for engaging the carrier and the integrated circuit package;
  a plurality of contacts arranged within the socket to make electrical contact with the leads of the integrated circuit package while said package is housed in said carrier; and
  a plurality of socket leads arranged to effectively engage the socket in a manufacturing device said socket leads not necessarily arranged in the lead footprint of the integrated circuit package.

* * * * *